United States Patent
Gauthier et al.

(10) Patent No.: US 10,186,605 B1
(45) Date of Patent: Jan. 22, 2019

(54) CYCLIC EPITAXY PROCESS TO FORM AIR GAP ISOLATION FOR A BIPOLAR TRANSISTOR

(71) Applicant: STMicroelectronics (Crolles 2) SAS, Crolles (FR)

(72) Inventors: Alexis Gauthier, Meylan (FR); Fabien Deprat, Chambery (FR); Yves Campidelli, Le Moutaret (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/783,109

(22) Filed: Oct. 13, 2017

(51) Int. Cl.
| | |
|---|---|
| H01L 29/732 | (2006.01) |
| H01L 29/66 | (2006.01) |
| H01L 29/737 | (2006.01) |
| H01L 27/06 | (2006.01) |
| H01L 21/8249 | (2006.01) |
| H01L 29/417 | (2006.01) |

(52) U.S. Cl.
CPC ...... *H01L 29/7322* (2013.01); *H01L 21/8249* (2013.01); *H01L 27/0623* (2013.01); *H01L 29/41708* (2013.01); *H01L 29/66242* (2013.01); *H01L 29/66287* (2013.01); *H01L 29/732* (2013.01); *H01L 29/7378* (2013.01)

(58) Field of Classification Search
CPC .......... H01L 29/7322; H01L 29/41708; H01L 21/8249; H01L 27/0623; H01L 29/66287; H01L 29/732; H01L 29/66242; H01L 29/7378
See application file for complete search history.

(56) References Cited

U.S. PATENT DOCUMENTS

| | | | |
|---|---|---|---|
| 6,940,149 B1 * | 9/2005 | Divakaruni | H01L 29/0649 257/565 |
| 9,368,608 B1 | 6/2016 | Camillo-Castillo et al. | |
| 2001/0017399 A1 | 8/2001 | Oda et al. | |
| 2002/0053705 A1 | 5/2002 | Kondo et al. | |
| 2007/0275533 A1 | 11/2007 | Vaed et al. | |

(Continued)

FOREIGN PATENT DOCUMENTS

EP 1087424 A1 3/2001

OTHER PUBLICATIONS

Diop, et al., "Impact of inside spacer process on fully self-aligned 250 GHz SiGe:C HBTs reliability performances: a-Si vs. nitride," Microelectronics Reliability, vol. 48, Issues 8-9, Aug.-Sep. 2008, pp. 1198-1201.

*Primary Examiner* — Victor A Mandala
(74) *Attorney, Agent, or Firm* — Crowe & Dunlevy

(57) ABSTRACT

A bipolar transistor is supported by a single-crystal silicon substrate including a collector contact region. A cyclical epitaxy process is performed to provide a collector region of a first conductivity type on the collector contact region that is laterally separated from a silicon layer by an air gap. A second epitaxial region forms a base region of a second conductivity type. Deposited semiconductor material forms an emitter region of the first conductivity type. The collector region, base region and emitter region are located within an opening formed in a stack of insulating layers that includes a sacrificial layer. The sacrificial layer is selectively removed to expose a side wall of the base region. Epitaxial growth from the exposed sidewall forms a base contact region.

37 Claims, 8 Drawing Sheets

(56) References Cited

U.S. PATENT DOCUMENTS

| | | | |
|---|---|---|---|
| 2010/0187657 A1* | 7/2010 | Boeck | H01L 29/0649 257/593 |
| 2013/0270649 A1* | 10/2013 | Chantre | H01L 27/1203 257/378 |
| 2014/0217551 A1* | 8/2014 | Dunn | H01L 29/66242 257/565 |
| 2015/0140771 A1 | 5/2015 | Fox et al. | |
| 2016/0211345 A1 | 7/2016 | Ding et al. | |
| 2016/0380088 A1* | 12/2016 | Camillo-Castillo | H01L 29/7371 438/319 |
| 2017/0236923 A1* | 8/2017 | Chevalier | H01L 29/732 257/578 |
| 2018/0240897 A1 | 8/2018 | Liu et al. | |

\* cited by examiner

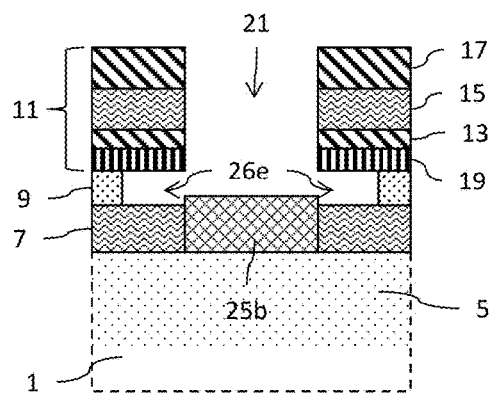
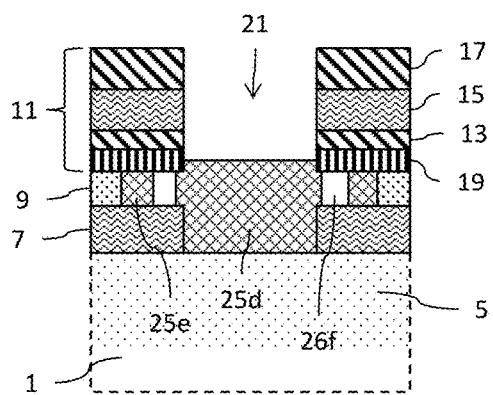
FIG. 3F    FIG. 3G
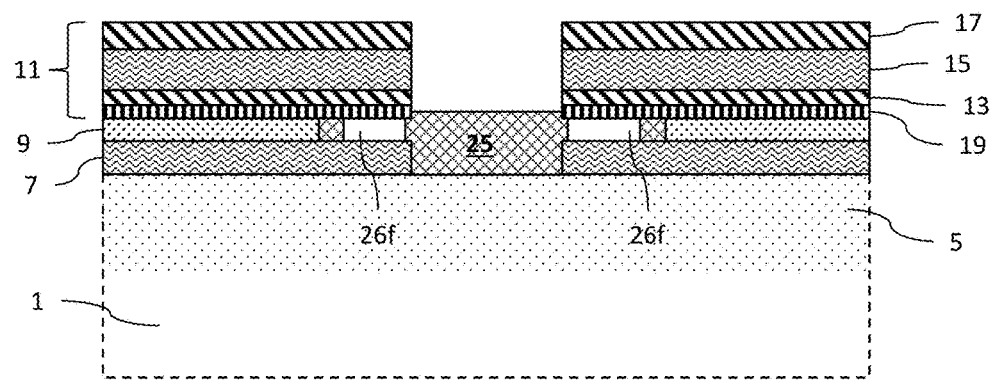
FIG. 4

CYCLIC EPITAXY PROCESS TO FORM AIR GAP ISOLATION FOR A BIPOLAR TRANSISTOR

TECHNICAL FIELD

The present disclosure relates to a process for the formation of an air gap for isolating collector and base regions of a bipolar transistor.

BACKGROUND

It is known in the art to include an air gap (i.e., a cavity filled with a gas having a low dielectric constant) in a bipolar transistor structure to provide isolation supporting a reduction in base-collector capacitance. See, for example, Unites States Patent Application Publication No. 2010/0187657. The process flow for fabrication of such a transistor in accordance with the prior art is quite complex and includes provision of a dielectric multilayer and multiple dry and wet etching operations. There are also concerns with connection to the intrinsic base as well as the fabrication of an intrinsic collector by epitaxy.

There exists a need in the art to provide a better fabrication process for the realization of air gap isolation structures. The also exists a need in the art to provide a better bipolar transistor collector/base isolation for improving transistor performance.

SUMMARY

In an embodiment, a method is provided for manufacturing a bipolar transistor in a structure including a single-crystal silicon substrate coated in succession with a first insulating layer, a silicon layer and an insulating region. The method comprises the steps of: a) etching an opening through the insulating region, the silicon layer and the first insulating layer to expose a top surface of the substrate; b) performing a cyclical epitaxy process in the opening to simultaneously laterally recess the silicon layer to form an open region that annularly surrounds the opening and epitaxially grow a collector region made of semiconductor material doped with a first conductivity type from the top surface of the silicon substrate, wherein the collector region closes off the annular open region to form an annular air spacer between the collector region and the silicon layer; c) in the opening, further forming by selective epitaxy from a top surface of the collector region a base region made of semiconductor material doped with a second conductivity type; and d) in the opening, further forming by deposition on a top surface of the base region, an emitter region made of semiconductor material doped with the first conductivity type.

In an embodiment, a method comprises: forming a collector contact region doped with a first conductivity type in a semiconductor substrate; providing a first insulating layer over the collector contact region; providing a first silicon layer over the first insulating layer; depositing an insulating region over the first silicon layer; etching an opening extending through the insulating region, the first silicon layer and the first insulating layer to expose a portion of the semiconductor substrate at said collector contact region; performing a cyclical epitaxy process in the opening to simultaneously laterally recess the silicon layer to form an open region that annularly surrounds the opening and epitaxially grow a collector region made of semiconductor material doped with a first conductivity type from the top surface of the semiconductor substrate, wherein the collector region closes off the annular open region to form an annular air spacer between the collector region and the silicon layer; epitaxially growing in said opening from the collector region a base region doped with a second conductivity type; depositing a second silicon layer doped with the first conductivity type in said opening on the base semiconductor layer to form an emitter region; selectively removing a portion of the insulating region to expose a side wall of said base region; and epitaxially growing from the exposed side wall a first portion of a base contact region.

In an embodiment, a bipolar transistor comprises: a single-crystal semiconductor substrate; a first insulating layer over the single-crystal semiconductor substrate; a silicon layer over the first insulating layer; an insulating region over the silicon layer; an opening extending through the insulating region, the silicon layer and the first insulating layer; a recess of the silicon layer providing an open region that annularly surrounds the opening; a semiconductor collector region doped with a first conductivity type within the opening and resting on the single-crystal semiconductor substrate, said semiconductor collector region closing off the annular open region to form an annular open spacer between the semiconductor collector region and the silicon layer; a semiconductor base region doped with a second conductivity type on top of the semiconductor collector region; a semiconductor emitter region doped with the first conductivity type on the semiconductor base region and laterally extending beyond the base semiconductor region; and a single crystal base contact region extending from a side wall of the semiconductor base region through the insulating region.

BRIEF DESCRIPTION OF THE DRAWINGS

The foregoing and other features and advantages will be discussed in detail in the following non-limiting description of specific embodiments in connection with FIGS. 1-2, 3A-3G and 4-14, these drawings being cross-section views illustrating steps of an embodiment of a method for manufacturing a bipolar transistor.

DETAILED DESCRIPTION

Figure 1:
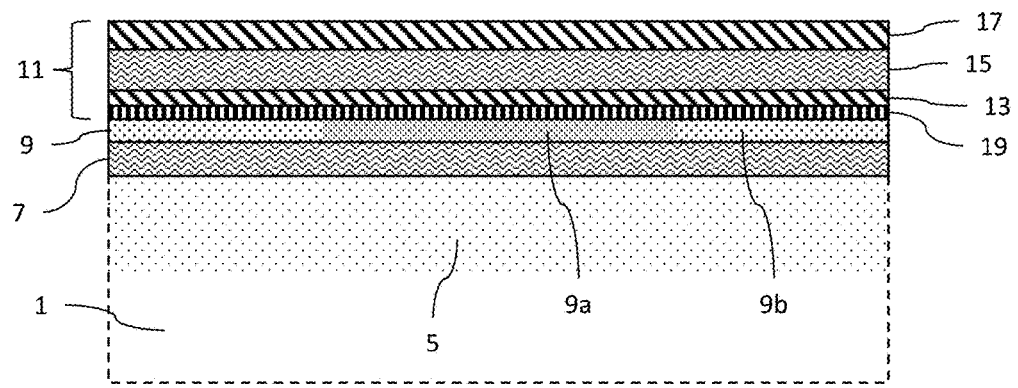

The same elements have been designated with the same reference numerals in the various drawings and, further, the various drawings are not to scale. For clarity, only those elements which are useful to the understanding of the described embodiments have been shown and are detailed. In particular, certain masks used during the steps of the manufacturing method described hereafter have not been shown.

In the following description, terms "high", "side", "lateral", "top", "above", "under", "on", "upper", and "lower" refer to the orientation of the concerned elements in the corresponding drawings.

In FIG. 1, a structure comprises a single-crystal silicon substrate 1 including a heavily-doped region 5 of a first conductivity type, for example, type N (using P or As as the dopant). The region 5 is flush with the upper (top) surface of substrate 1 and forms a collector contact region for the bipolar transistor. The upper surface of substrate 1 is coated with an insulating layer 7 (made of silicon dioxide, for example) that is coated with a semiconductor material layer 9. Layer 9 may be made of a polysilicon semiconductor material. Layer 9 may alternatively be made of a single-crystal silicon semiconductor material.

Where the layer 9 is single-crystal semiconductor material, the substrate 1, insulating layer 7 and semiconductor layer 9 may correspond to an SOI (Semiconductor On Insulator) type of substrate known to those skilled in the art. Layer 9 may have a doping of a second conductivity type, for example, type P. In the implementation with a single-crystal semiconductor material layer 9, a portion 9a of the single-crystal layer 9 is converted to amorphous semiconductor material using a mask and an implantation process. The reason for the alteration of the crystal structure in portion 9a is explained in detail below. The remainder 9b of layer 9 remains single-crystal semiconductor material.

A stack of layers 11 forming an insulating region rests on layer 9. The stack 11 comprises a first insulating layer 19 that is coated with a second insulating layer 13 (also referred to herein as a first sacrificial layer) that is coated with a third insulating layer 15 that is coated with a fourth insulating layer 17 (also referred to herein as a second sacrificial layer). The material of layers 15 and 19 and the material of layers 13 and 17 are selected to be selectively etchable over each other. In an embodiment, the layers 13 and 17 are made of silicon nitride and the layers 15 and 19 are made of silicon oxide.

Figure 2:
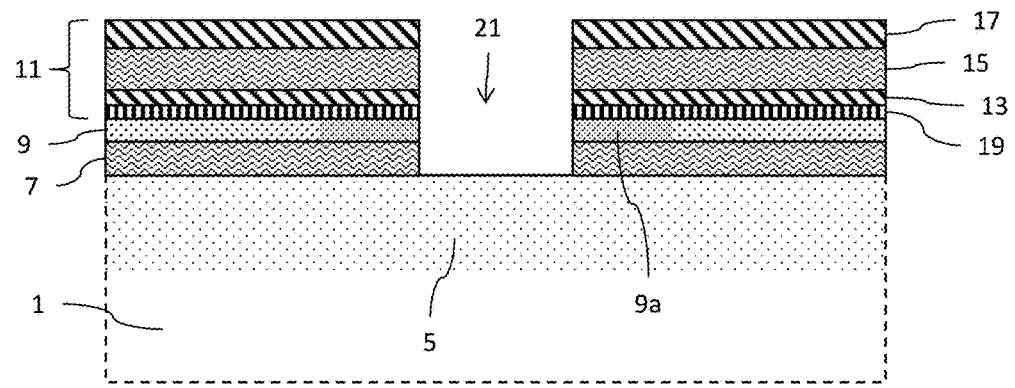

FIG. 2 shows the structure after the etching of an opening 21 that crosses completely through the stack 11, the silicon layer 9, and the insulating layer 7 all the way to reach the doped region 5 at the top surface of the substrate 1. The etch process used may, for example, comprise major anisotropic and minor isotropic etch steps. In the context of a single-crystal semiconductor material for the layer 9, the opening 21 passes through the amorphous semiconductor material portion 9a.

Figure 3A:
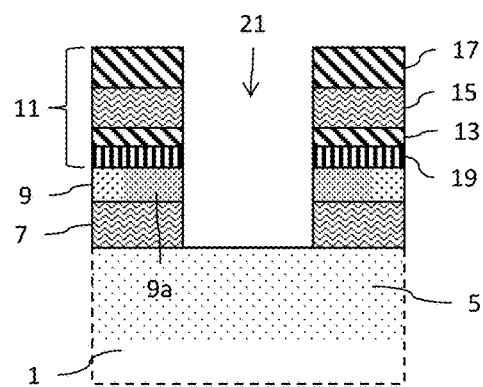

FIGS. 3A-3G illustrate the performance of a selective cyclical epitaxy process used to form, within the opening 21, a collector region 25 of the bipolar transistor. Each cycle of the epitaxy process uses an etch followed by an epitaxial growth. FIG. 3A shows a close up view of the opening 21 of FIG. 2 as the starting point of the selective cyclical epitaxy process.

Figure 3B:
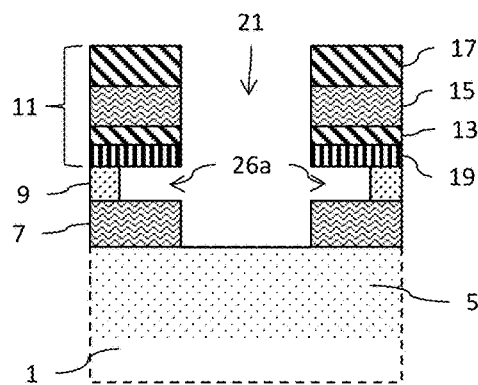
Figure 3C:
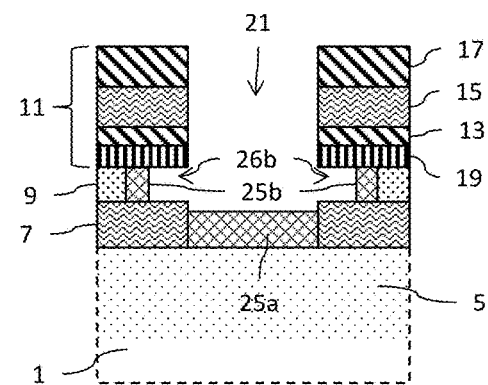

FIGS. 3B-3C show one cycle of the cyclical epitaxy process with FIG. 3B showing the result of the etch and FIG. 3C showing the result of the epitaxial growth. The etch, for example, an HCl etch, attacks the semiconductor material of the portion 9a of the layer 9 at a greater rate than the semiconductor material of substrate 1. As a result, there is a lateral etch of the layer 9 which forms an open region 26a as shown in FIG. 3B. The open region 26a annularly surrounds the opening 21. In the context of a single-crystal semiconductor material for the layer 9, the etch attacks and removes the amorphous semiconductor material portion 9a. The epitaxial growth forms a single-crystal silicon region 25a from the top surface of substrate 1 and a semiconductor region 25b from the side wall of the layer 9 within the open region 26a (now referenced as region 26b) as shown in FIG. 3C. The semiconductor region 25b has a crystal structure which conforms to the crystal structure of the exposed side wall of the layer 9 within the open region 26a. If the layer 9 is polysilicon, the region 25b will also be polysilicon. If the layer 9 is single-crystal silicon, the region 25b will also be single-crystal silicon.

Figure 3D:
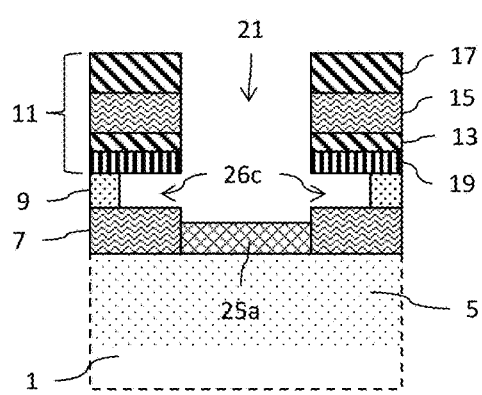
Figure 3E:
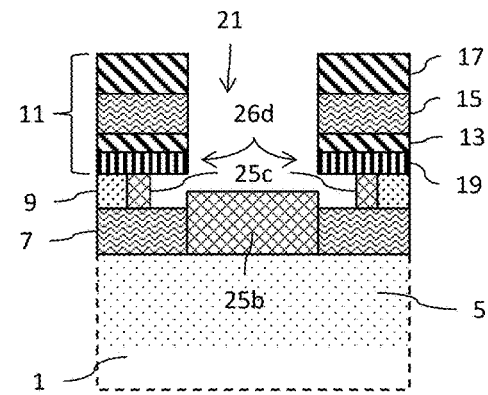

FIGS. 3D-3E show a further cycle of the cyclical epitaxy process with FIG. 3D showing the result of the etch and FIG. 3E showing the result of the epitaxial growth. It will be understood that the further cycle as shown by FIGS. 3D-3E may not be the immediately successive cycle following the cycle of FIGS. 3B-3C. In other words, there may be one or more cycles between the cycle of FIGS. 3B-3C and the cycle of FIGS. 3D-3E. The etch attacks the semiconductor material of region 25b at a greater rate than the semiconductor material of region 25a. As a result, there is a lateral etch at the level of the layer 9 which forms an open region 26c as shown in FIG. 3D. The open region 26c annularly surrounds the opening 21. The epitaxial growth further extends the thickness of the single-crystal silicon region 25a from the top surface of substrate 1 (providing region 25b) and forms semiconductor region 25c at the side wall of the layer 9 within the open region 26c (now referenced as region 26d) as shown in FIG. 3E.

FIGS. 3F-3G show yet a further cycle of the cyclical epitaxy process with FIG. 3F showing the result of the etch and FIG. 3G showing the result of the epitaxial growth. It will be understood that the further cycle as shown by FIGS. 3F-3G may not be the immediately successive cycle following the cycle of FIGS. 3D-3E. In other words, there may be one or more cycles between the cycle of FIGS. 3D-3E and the cycle of FIGS. 3F-3G. The etch attacks the semiconductor material of region 25c at a greater rate than the semiconductor material of region 25b. As a result, there is a lateral etch at the level of the layer 9 which forms an open region 26e as shown in FIG. 3F. The open region 26e annularly surrounds the opening 21. The epitaxial growth further extends the thickness of the single-crystal silicon region 25b from the top surface of substrate 1 (providing region 25d) to close off the open region 26e (now referenced as region 26f; also referred to herein as an air gap or air spacer between the sidewall of the region 25 and the semiconductor layer 9) and forms a semiconductor region 25e from the side wall of the layer 9 within the open region 26e as shown in FIG. 3G. The region 25d provides the collector region 25 of the transistor. The annular open regions 26f completely surround the collector region 25, and in this configuration will annularly surround the opening 21. The annular open regions 26f may, for example, have cross-sectional dimensions of a height in the range of 10-30 nm and a width in the range of 10-50 nm.

The cyclical epitaxy process is repeated as many times as needed so as to provide the collector region 25 with a thickness such that a top surface of the region 25 is at least as high as a top surface of the layer 9 and lower than or equal to a bottom surface of layer 13. Preferably, the level of the top surface of collector region 25 is slightly lower, for example, by from 1 to 3 nm, than the lower surface of layer 13. The collector region 25 is doped during the epitaxy or by implantation after the epitaxy with the first conductivity type. As an example, the collector region 25 is doped with phosphorus atoms, possibly associated with carbon atoms to limit the exodiffusion of phosphorus atoms, and/or with arsenic atoms.

FIG. 4 shows the structure after completion of the selective cyclical epitaxy process.

Figure 5:
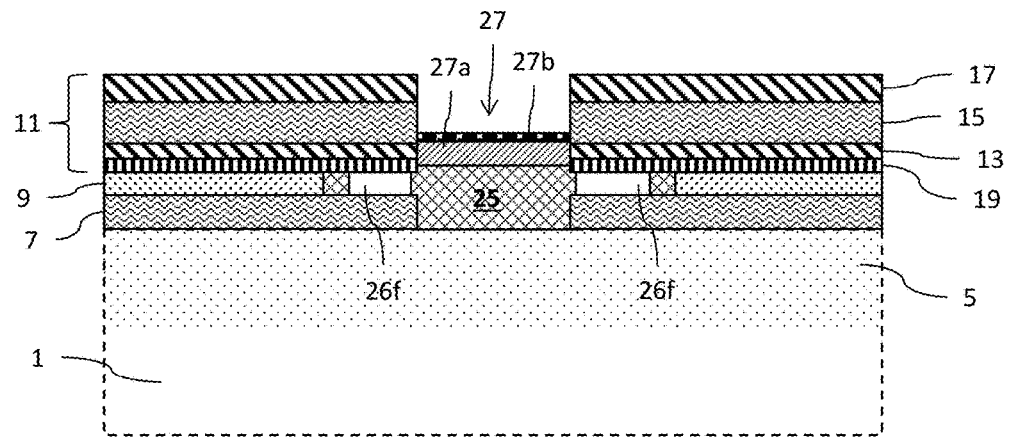

FIG. 5 shows the structure after the forming, in opening 21, a transistor base region 27 comprising a stack of a doped region 27a and a silicon capping region 27b. The doped region 27a of the transistor base region 27 is made of a single-crystal semiconductor material such as silicon or, preferably, silicon-germanium as in the present embodiment. Doped region 27a is formed by selective epitaxy from the top surface of the collector region 25. The doped region 27a has a thickness such that a top surface of the doped region 27a is at or higher than a top surface of the insulating layer 13 but below the top surface of the layer 15. The doped region 27a is doped with the second conductivity type, preferably during the epitaxy. As an example, doped region 27a is doped with boron atoms, possibly associated with carbon atoms to avoid the exodiffusion of the boron atoms. The silicon capping region 27b is made of undoped single crystal semiconductor material and is formed by selective epitaxy from the top surface of the doped region 27a. The silicon capping region 27b has a thickness such that a top surface of the silicon capping region 27b is below the top surface of the layer 15.

Figure 6:
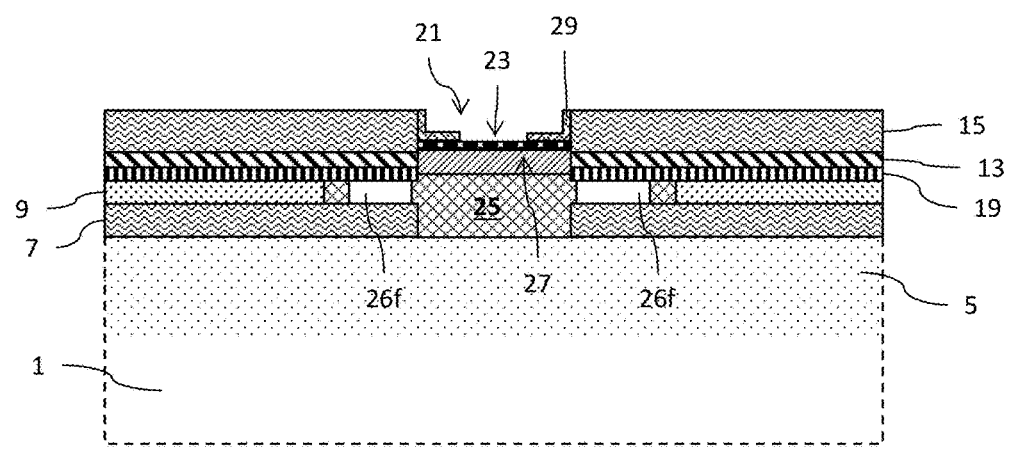

In FIG. 6, spacers 29 have been formed in the opening 21. The spacers 29 rest on the top surface of silicon capping region 27b and border the sidewall surfaces of at least the layer 15. An opening 23 is provided between the spacers 29 to expose a top surface of the silicon capping region 27b. The spacers 29 have, for example, in cross-sectional view, an L shape. As an example, the spacers 29 are made of silicon oxide. The second sacrificial layer 17 has also been removed in connection with completion of the fabrication of the spacers 29.

Figure 7:
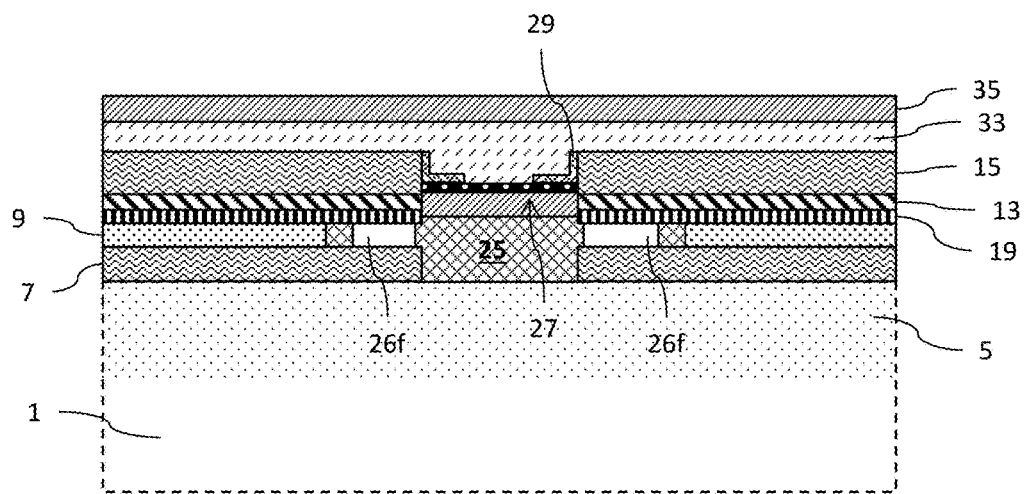

A silicon layer 33 doped with the first conductivity type is deposited over all of the structure and fills openings 21 and 23. As an example, the silicon layer is deposited by RTCVD ("Reduced Temperature Chemical Vapor Deposition"), which enables the deposited silicon to be monocrystalline at the interface with the silicon capping region 27b of the transistor base region 27. A chemical mechanical polish may then be performed to planarize the top surface of the layer 33. An etch mask formed by a layer 35 (made of silicon oxide, for example) is then formed on the planar top surface of layer 33. The result is shown in FIG. 7.

Figure 8:
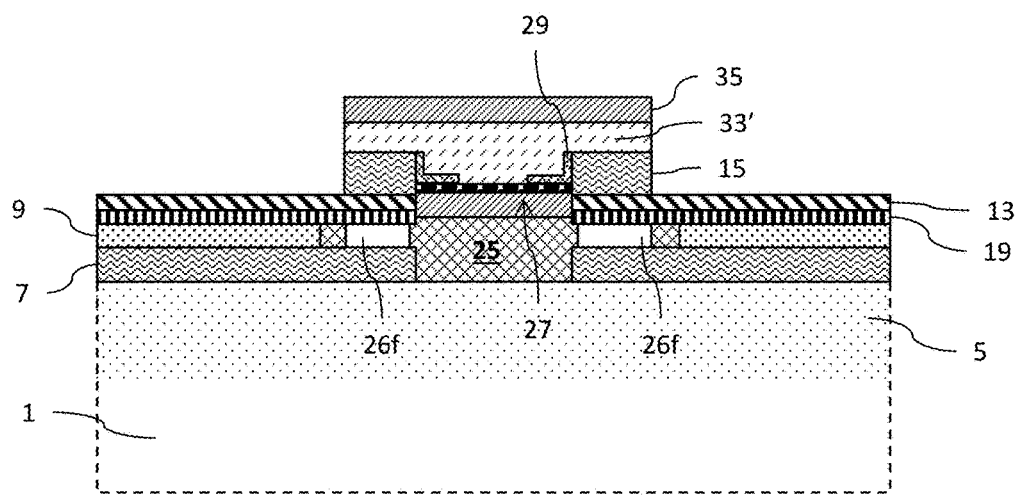

Convention lithographic processing is then performed to pattern the etch mask layer 35. An anisotropic etch is then performed to remove the unmasked portion of the doped silicon layer 33 and the unmasked portion of the oxide layer 15 all the way to nitride layer 13. The result is shown in FIG. 8. Thus, a portion 33' of the silicon layer 33 is left in place and forms the emitter region of the bipolar transistor. The emitter region 33' comprises a central portion resting on the transistor base region 27 at silicon capping region 27b (extending through the opening 23) and a peripheral portion that laterally extends beyond the base region 27 and rests on a remaining portion of the layer 15.

Figure 9:
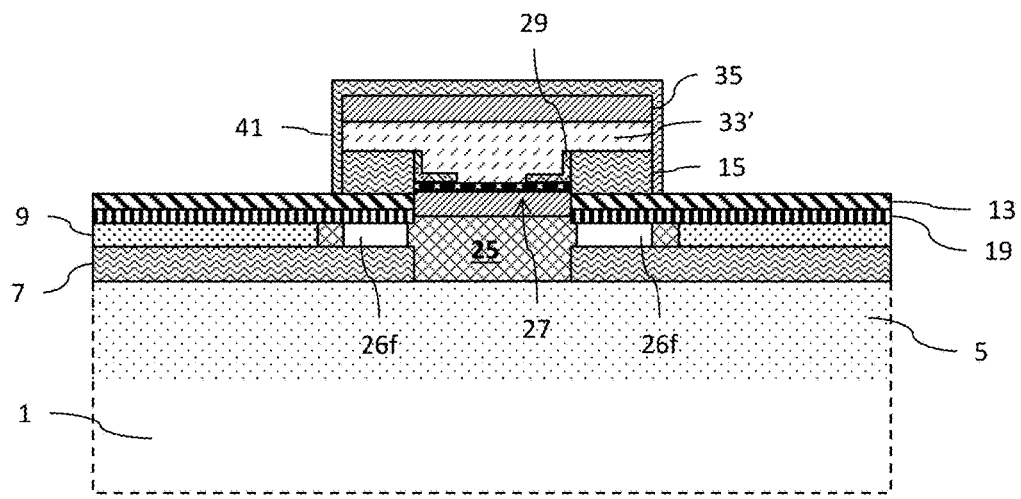

A deposition of a silicon oxide layer 41 is made to cover the top of layer 35 and the side walls of the emitter region 33' and the side walls of the remaining portion of the oxide layer 15. Then, an anisotropic etch is performed to remove the silicon oxide from the top surface of the first sacrificial layer 13. The result is shown in FIG. 9. In an embodiment, the layer 35 may be removed prior to the deposition of layer 41.

Figure 10:
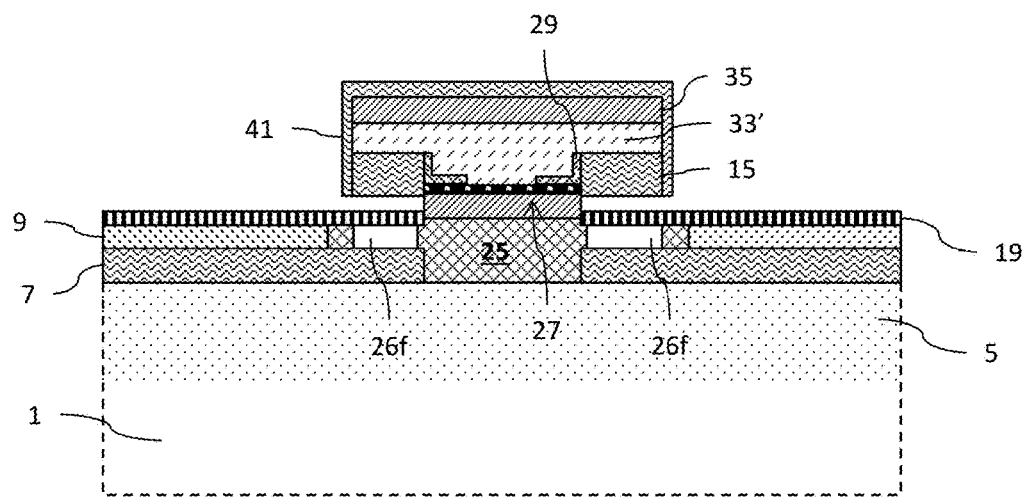

In the step illustrated by FIG. 10, the first sacrificial nitride layer 13 has been removed by isotropic etching selective over the material of layers 15, 19 and 41. This exposes the lateral side wall of the base region 27 (more specifically, a lateral side wall of the doped region 27a).

Figure 11:
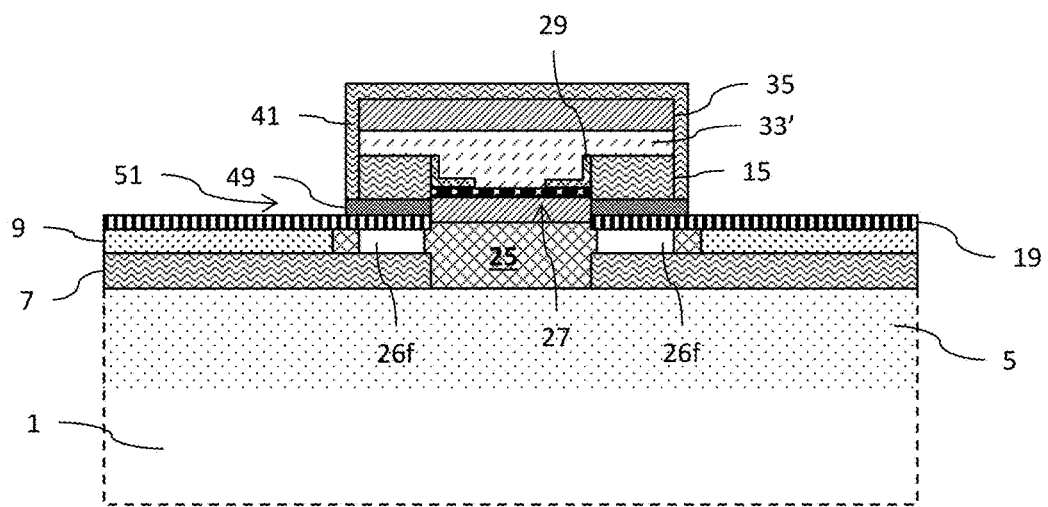

FIG. 11 shows the structure after formation of a first portion 49 of a base contact region 51. The first portion 49 is made of single-crystal silicon formed by selective epitaxy from the lateral side wall of the base region 27. Thus, the portion 49 of the base contact region 51 is monocrystalline, which advantageously enables to decrease the resistance at the interface between base contact region 51 and base region 27 with respect to the case of a transistor which would have its base contact region made of polysilicon. In this example, the first portion 49 of base contact region 51 extends laterally all the way at least to the peripheral edge of the remaining portion of layer 41.

Figure 12:
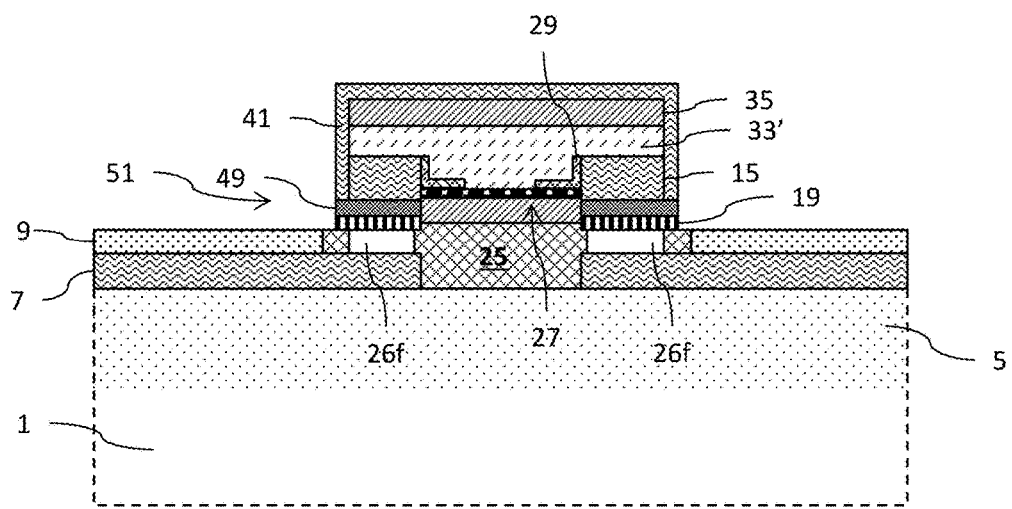

Conventional isotropic etching techniques are then used to selectively remove a portion of insulating layer 19 and expose a top surface of the semiconductor layer 9. The result is shown in FIG. 12.

Figure 13:
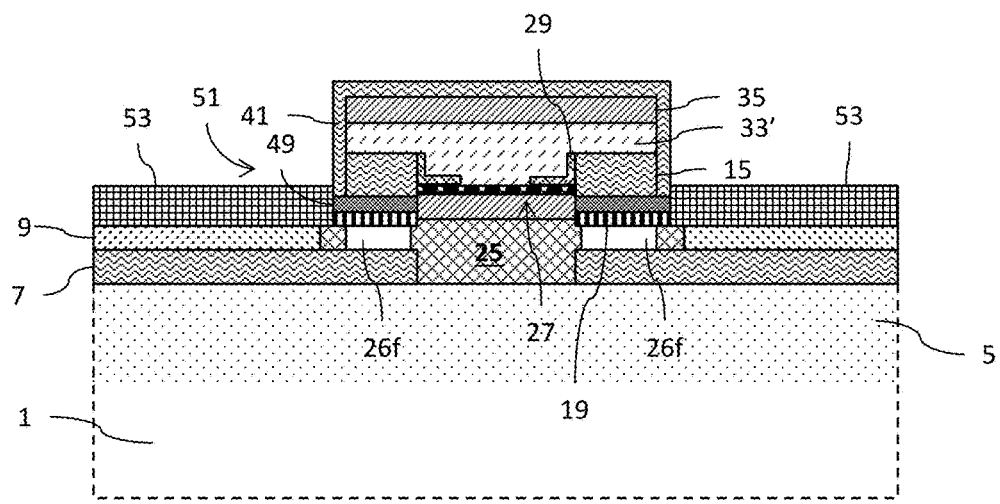

FIG. 13 shows the structure after formation of a second portion 53 of the base contact region 51. In one embodiment, the second portion 53 is made of polycrystalline silicon formed by selective epitaxy of doped silicon of the second conductivity type from the top surface of the polysilicon semiconductor layer 9 and the lateral side wall of the first portion 49. In another embodiment, the second portion 53 is made of single-crystal silicon formed by selective epitaxy of doped silicon of the second conductivity type from the top surface of the single-crystal semiconductor layer 9 and the lateral side wall of the first portion 49. For the configuration where silicon layer 9 was not doped at the step of FIG. 1, it may be doped by diffusion of dopant atoms from the base contact region 51, and in particular from the first portion 49.

Figure 14:
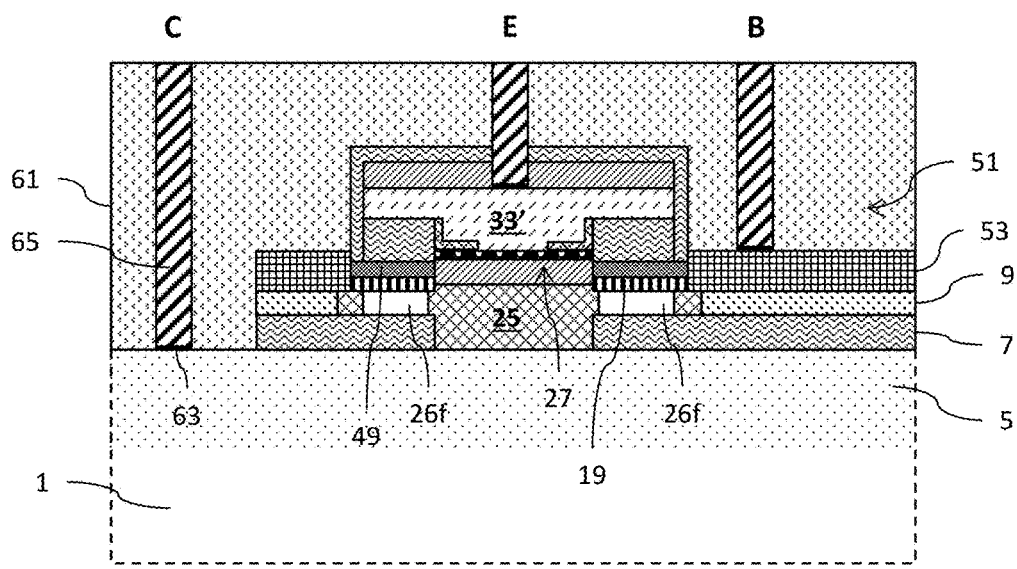

An example of the configuration for making electrical contact to the emitter (E), base (B) and collector (C) terminals of the heterojunction bipolar transistor is shown in FIG. 14. A premetallization dielectric layer 61 covers the structure. A layer of silicide 63 is provided at each contact location with the collector contact region 5, the emitter region 33' and the base contact region 51. A metal contact plug 65 extends through the premetallization dielectric layer 61 to make contact with the silicide 63.

Advantageously, where the semiconductor layer 9 is made of single-crystal silicon and the second portion 53 of base contact region 51 is also made of single-crystal silicon grown by selective epitaxy, the entire base contact region 51 will be made of single-crystal silicon. This configuration enables to decrease the resistance of base contact region 51, and thus decrease the resistance of access to the base region 27 as compared to the case of a transistor where all or part of the base contact region is made of polysilicon.

Access to the collector contact region 5 for the purpose of exposing the top surface of the substrate 1 can be achieved by forming a mask over the emitter region 33' and on portions of the base contact region 51 that laterally extend adjacent to the emitter region 33'. An etch may then be performed through the mask. The premetallization dielectric layer 61 may then be deposited over the structures.

The silicide process to form silicide layers 63 may be performed using well known techniques at any suitable point in the fabrication process. The silicide layers 63 are formed at the upper surface of the emitter region 33', on the upper surface of collector contact region 5, and on the upper surface of the base contact region 51.

In an alternative implementation, the first and second portions 49 and 53 of the base contact region 51 may be formed simultaneously. To achieve this, the nitride layer 13 is removed to expose the lateral side wall of the base region 27 and the portion of insulating layer 19 is removed to expose the top surface of the semiconductor layer 9. These removal steps are performed prior to performing any epitaxial growth. Then, the first and second portions 49 and 53 are simultaneously formed by epitaxy from the side wall of base region 27 and the top surface of silicon layer 9. A structure similar to that shown in FIG. 13 is then obtained.

In the transistor of FIG. 14, the base contact region 51 is insulated from the collector region 25 by the air spacer 26f and the remaining portion of the layer 19. The base contact region 51 makes contact with the base region 27 at the level of at least part of the side wall of the base region 27. This structure minimizes the risk of diffusion of dopant atoms from the base contact region 51 to the collector region 25.

As a result, there is a reduction in base-collector capacitance. Still further, this permits an increase in the doping level of the base contact region 51 so as to achieve a decrease in access resistance to the base region 27 without concern that this increased doping will lead to an increase in the base-collector capacitance.

Advantageously, in the transistor of FIG. 14, the shortest conductive path between the base region 27 and silicide 63 for the base contact region 51 is made of single-crystal semiconductor material. As a result, the resistance of access to the base region 27 is reduced.

Further, in the transistor of FIG. 14, the separation between the upper level of base contact region 51 and the lower level of emitter region 33' can be controlled by the process step of epitaxial growth of the second portion 53 so as to decrease the stray capacitance between base contact region 51 and the emitter region 33'.

Advantageously, the previously-described method enables to form in self-aligned fashion the collector region 25, base region 27, and emitter region 33' of a bipolar transistor without providing many masking and/or etch steps.

Each step of the previously-described method is a step currently used in standard CMOS methods, whereby this method is compatible with standard CMOS methods.

As an example, the various previously-described layers, regions, portions may have the following dimensions:
- a thickness in the range from 10 to 75 nm, for example, 25 nm, for insulating layer 7;
- a thickness in the range from 3 to 20 nm, for example, 7 nm, for silicon layer 9;
- a thickness in the range from 10 to 40 nm, for example, 20 nm, for insulating layer 13;
- a thickness in the range from 5 to 20 nm, for example, 10 nm, for insulating layer 19;
- a thickness in the range from 10 to 50 nm, for example, 25 nm, for layers 15 and 17;
- a width from 0.1 to 0.3 µm, for example, 0.2 µm, for opening 21; and
- a thickness in the range from 50 to 200 nm, for example, 75 nm, for the silicon layer 33.

The doping levels of the various previously-described layers, regions, portions will be selected conventionally.

Specific embodiments have been described. Various alterations, modifications, and improvements will occur to those skilled in the art. In particular, the number and the order of the steps of the previously-described method may be adapted by those skilled in the art. For example, the steps of cleaning the exposed surfaces of the semiconductor regions from which the epitaxies are performed may be provided before each epitaxy step. Additional spacer structures may be provided as needed. During the step of forming the collector region 25, only a central and/or lower portion of region 25 may be doped by selective implantation of dopant atoms.

It will readily occur to those skilled in the art that the previously-indicated conductivity types for the layers, regions, etc. may all be inverted.

Although an embodiment of a method where the base region 27 is made of silicon-germanium has been described, the base region 27 may also be formed by epitaxy of silicon, germanium, or another semiconductor material capable of growing by epitaxy from silicon and from which silicon can grow by epitaxy. For example, this method may be used to manufacture transistors using III-V semiconductors.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a bipolar transistor in a structure including a single-crystal silicon substrate coated in succession with a first insulating layer, a silicon layer and an insulating region, the method comprising the steps of:
   a) etching an opening through the insulating region, the silicon layer and the first insulating layer to expose a top surface of the substrate;
   b) performing a cyclical epitaxy process in the opening to simultaneously laterally recess the silicon layer to form an open region that annularly surrounds the opening and epitaxially grow a collector region made of semiconductor material doped with a first conductivity type from the top surface of the silicon substrate, wherein the collector region closes off the annular open region to form an annular air spacer between the collector region and the silicon layer;
   c) in the opening, further forming by selective epitaxy from a top surface of the collector region a base region made of semiconductor material doped with a second conductivity type; and
   d) in the opening, further forming by deposition on a top surface of the base region, an emitter region made of semiconductor material doped with the first conductivity type.

2. The method of claim 1, further comprising:
   forming the insulating region to include a stack of layers comprising a sacrificial layer made of a first material arranged between two insulating layers made of a second material selectively etchable over the first material;
   removing the sacrificial layer to expose a side wall of the base region; and
   forming a base contact region by epitaxy from the side wall of the base region exposed by the removal of the sacrificial layer.

3. The method of claim 2, wherein forming the base region comprises forming the base region to a height at least as high as an upper level of the sacrificial layer.

4. The method of claim 2, further comprising etching through said stack to reach a top surface of the silicon layer, and wherein forming the base contact region further comprises forming the base contact region by epitaxy from the top surface of the silicon layer.

5. The method of claim 4, wherein the epitaxy used to form the base contact region is a simultaneous epitaxy from both the side wall of the base region exposed by the removal of the sacrificial layer and the top surface of the silicon layer.

6. The method of claim 2, wherein the first material is silicon nitride and the second material is silicon oxide.

7. The method of claim 1, further comprising doping a region of the single-crystal silicon substrate to form a collector contact region to the collector region.

8. The method of claim 1, wherein said silicon layer is a single-crystal silicon layer, further comprising the step of amorphizing a portion of said silicon layer, wherein etching the opening comprises etching the opening to extend through the amorphized portion of said silicon layer, and wherein the cyclical epitaxy process removes the amorphized portion of said silicon layer to form the annular open region.

9. The method of claim 8, wherein the single-crystal silicon substrate, first insulating layer and single-crystal silicon layer form a silicon on insulator (SOI) type substrate.

10. The method of claim 1, further comprising:
siliciding a top surface portion of each of the single-crystal silicon substrate, a base contact region electrically coupled to the base region and the emitter region;
depositing a premetallization dielectric layer; and
forming metal contacts extending through the premetallization dielectric layer to reach each silicided top surface portion.

11. The method of claim 10, further comprising forming the base contact region by epitaxy from a side wall of the base region.

12. The method of claim 11, further comprising removing a portion of said insulating region to expose the side wall of the base region for epitaxy.

13. The method of claim 1, wherein forming the base region comprises forming a first portion made of semiconductor material doped with the second conductivity type and forming a second portion made of semiconductor material that is undoped.

14. The method of claim 1, wherein the semiconductor material of the collector region is silicon.

15. The method of claim 1, wherein the semiconductor material of the base region is silicon-germanium.

16. The method of claim 1, wherein the semiconductor material of the emitter region is silicon.

17. The method of claim 1, wherein the cyclical epitaxy process comprises a repetition of a step of etching and a subsequent step for epitaxial growth.

18. The method of claim 1, wherein annular air spacer has cross-sectional dimensions of a height in the range of 10-30 nm and a width in the range of 10-50 nm.

19. A method, comprising:
forming a collector contact region doped with a first conductivity type in a semiconductor substrate;
providing a first insulating layer over the collector contact region;
providing a first silicon layer over the first insulating layer;
depositing an insulating region over the first silicon layer;
etching an opening extending through the insulating region, the first silicon layer and the first insulating layer to expose a portion of the semiconductor substrate at said collector contact region;
performing a cyclical epitaxy process in the opening to simultaneously laterally recess the silicon layer to form an open region that annularly surrounds the opening and epitaxially grow a collector region made of semiconductor material doped with a first conductivity type from the top surface of the semiconductor substrate, wherein the collector region closes off the annular open region to form an annular air spacer between the collector region and the silicon layer;
epitaxially growing in said opening from the collector region a base region doped with a second conductivity type;
depositing a second silicon layer doped with the first conductivity type in said opening on the base semiconductor layer to form an emitter region;
selectively removing a portion of the insulating region to expose a side wall of said base region; and
epitaxially growing from the exposed side wall a first portion of a base contact region.

20. The method of claim 19, wherein depositing the insulating region comprises forming a stack of layers over the first silicon layer, said stack of layers comprising a second insulating layer, a sacrificial layer and a third insulating layer, and wherein selectively removing the portion comprises removing the sacrificial layer to expose the side wall of said base region.

21. The method of claim 20, further comprising:
removing the second insulating layer to expose an upper surface of the first silicon layer; and
epitaxially growing from the exposed upper surface of the first silicon layer a second portion of the base contact region.

22. The method of claim 21, further comprising:
siliciding an upper surface of the second portion of the base contact region; and
siliciding an upper surface of the emitter region.

23. The method of claim 22, further comprising siliciding an upper surface of the semiconductor collector region.

24. The method of claim 20, wherein epitaxally growing the base region comprises epitaxially forming a first portion doped with the second conductivity type and a second portion that is undoped.

25. The method of claim 19, wherein the cyclical epitaxy process comprises a repetition of a step of etching and a subsequent step for epitaxial growth.

26. The method of claim 19, wherein annular air spacer has cross-sectional dimensions of a height in the range of 10-30 nm and a width in the range of 10-50 nm.

27. A bipolar transistor, comprising:
a single-crystal semiconductor substrate;
a first insulating layer over the single-crystal semiconductor substrate;
a silicon layer over the first insulating layer;
an insulating region over the silicon layer;
an opening extending through the insulating region, the silicon layer and the first insulating layer;
a recess of the silicon layer providing an open region that annularly surrounds the opening;
a semiconductor collector region doped with a first conductivity type within the opening and resting on the single-crystal semiconductor substrate, said semiconductor collector region closing off the annular open region to form an annular open spacer between the semiconductor collector region and the silicon layer;
a semiconductor base region doped with a second conductivity type on top of the semiconductor collector region;
a semiconductor emitter region doped with the first conductivity type on the semiconductor base region and laterally extending beyond the base semiconductor region; and
a single crystal base contact region extending from a side wall of the semiconductor base region through the insulating region.

28. The transistor of claim 27, wherein said insulating region includes two insulating layer and wherein the single crystal base contact region passes between the two insulating layers.

29. The transistor of claim 27, wherein said single crystal base contact region includes a first single crystal portion extending through the insulating region and a second single crystal portion extending from the single-crystal semiconductor substrate.

30. The transistor of claim 27, further comprising:
a silicide layer a top surface portion of each of the single-crystal silicon substrate, the single crystal base contact region and the emitter region;
a premetallization dielectric layer; and metal contacts extending through the premetallization dielectric layer to reach each silicide layer.

31. The transistor of claim 27, wherein the single-crystal silicon substrate, first insulating layer and silicon layer form a silicon on insulator (SOI) type substrate.

32. The transistor of claim 27, further comprising a collector contact region located within the single-crystal silicon substrate under the semiconductor collector region with the first conductivity type.

33. The transistor of claim 27, wherein the semiconductor collector region is made of a silicon material.

34. The transistor of claim 27, wherein the semiconductor base region is made of a silicon-germanium material.

35. The transistor of claim 27, wherein the semiconductor emitter region is made of a silicon material.

36. The transistor of claim 27, wherein the semiconductor base region includes a first portion doped with the second conductivity type and a second portion that is undoped.

37. The transistor of claim 27, wherein the annular open spacer has cross sectional dimensions of a height in a range of 10-30 nm and a width in a range of 10-50 nm.

\* \* \* \* \*